United States Patent
Dong et al.

(10) Patent No.: US 11,619,773 B2
(45) Date of Patent: Apr. 4, 2023

(54) METHOD OF MANUFACTURING METAL WIRE AND METAL WIRE GRID, WIRE GRID POLARIZER, ELECTRONIC DEVICE

(71) Applicant: BOE TECHNOLOGY GROUP CO., LTD., Beijing (CN)

(72) Inventors: Shuilang Dong, Beijing (CN); Xin Gu, Beijing (CN); Kang Guo, Beijing (CN); Da Lu, Beijing (CN); Qingzhao Liu, Beijing (CN); Lei Zhao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 781 days.

(21) Appl. No.: 16/485,810

(22) PCT Filed: Jan. 24, 2019

(86) PCT No.: PCT/CN2019/072993
§ 371 (c)(1),
(2) Date: Aug. 14, 2019

(87) PCT Pub. No.: WO2020/010838
PCT Pub. Date: Jan. 16, 2020

(65) Prior Publication Data
US 2021/0333457 A1 Oct. 28, 2021

(30) Foreign Application Priority Data
Jul. 11, 2018 (CN) .......................... 201810759614.6

(51) Int. Cl.
*C23F 1/12* (2006.01)
*G02B 5/30* (2006.01)
(Continued)

(52) U.S. Cl.
CPC .............. *G02B 5/3058* (2013.01); *C23F 1/12* (2013.01); *G03F 7/0005* (2013.01); *G03F 7/167* (2013.01); *G03F 7/427* (2013.01)

(58) Field of Classification Search
None
See application file for complete search history.

(56) References Cited

U.S. PATENT DOCUMENTS 5,801,101 A * 9/1998 Miyoshi .............. H01L 21/3213
257/E21.305
6,242,358 B1 6/2001 Chu et al.
(Continued)

FOREIGN PATENT DOCUMENTS

CN 101894790 A 11/2010
CN 102129975 A 7/2011
(Continued)

OTHER PUBLICATIONS

Chinese Office Action dated Feb. 3, 2020 corresponding to Chinese Patent Application No. 201810759614.6; 21 pages.

*Primary Examiner* — Shamim Ahmed
(74) *Attorney, Agent, or Firm* — Leason Ellis LLP

(57) ABSTRACT

A method of manufacturing a metal wire, a method of manufacturing a metal wire grid, a wire grid polarizer, and an electronic device are provided. The method of manufacturing a metal wire includes: forming a metal material layer on a base substrate; etching the metal material layer by using a composite gas including an etching gas and a coating reaction gas to form the metal wire and a protective coating layer on a surface of the metal wire.

12 Claims, 5 Drawing Sheets

(51) Int. Cl.
  *G03F 7/00*  (2006.01)
  *G03F 7/16*  (2006.01)
  *G03F 7/42*  (2006.01)

(56) References Cited

U.S. PATENT DOCUMENTS

| | | | | |
|---|---|---|---|---|
| 6,383,942 | B1* | 5/2002 | Narita | H01L 21/32136 |
| | | | | 216/75 |
| 6,635,185 | B2* | 10/2003 | Demmin | H01L 21/32137 |
| | | | | 257/E21.252 |
| 7,169,695 | B2* | 1/2007 | Huang | H01L 21/31144 |
| | | | | 438/626 |
| 10,508,346 | B2 | 12/2019 | Huo et al. | |
| 2006/0172540 | A1* | 8/2006 | Marks | H01L 21/32139 |
| | | | | 438/700 |
| 2007/0249172 | A1* | 10/2007 | Huang | H01L 21/76808 |
| | | | | 700/121 |
| 2015/0263057 | A1 | 9/2015 | Ogasawara et al. | |
| 2019/0285946 | A1 | 9/2019 | Wang et al. | |

FOREIGN PATENT DOCUMENTS

| | | |
|---|---|---|
| CN | 104916652 | 9/2015 |
| CN | 106206290 A | 12/2016 |
| CN | 107193158 A | 9/2017 |
| CN | 107910258 A | 4/2018 |
| CN | 108919407 A | 11/2018 |
| JP | 08306660 A | 11/1996 |
| JP | 11214370 A | 8/1999 |

* cited by examiner

METHOD OF MANUFACTURING METAL WIRE AND METAL WIRE GRID, WIRE GRID POLARIZER, ELECTRONIC DEVICE

CROSS-REFERENCE TO RELATED APPLICATIONS

This application is a U.S. National Stage Application under 35 U.S.C, § 371 of International Patent Application No. PCT/CN2019/072993, filed Jan. 24, 2019, which claims the benefit of priority to Chinese Patent Application No. 201810759614.6, filed on Jul. 11, 2018, both of which are incorporated herein by reference in their entireties as part of the present application.

TECHNICAL FIELD

The embodiments of the present disclosure relate to a method of manufacturing a metal wire, a method of manufacturing a metal wire grid, a wire grid polarizer, and an electronic device.

BACKGROUND

A metal wire can be prepared, for example, by an etching method. The etching method comprises, for example, forming a metal material layer, and then etching the metal material layer by an etching process to remove an unnecessary part of the metal material to form a metal wire. The metal wire obtained by the etching method can be used as a signal line for a circuit structure, an electronic device, or the like, and can also be used as a metal wire grid structure for a wire grid polarizer, or the like.

SUMMARY

At least one embodiment of the present disclosure provides a method of manufacturing a metal wire, comprising: forming a metal material layer on a base substrate; and etching the metal material layer by using a composite gas comprising an etching gas and a coating reaction gas to form the metal wire and a protective coating layer on a surface of the metal wire.

For example, in the method of manufacturing a metal wire provided by at least one embodiment of the present disclosure, the protective coating layer is formed at least on a part of lateral side walls of the metal wire.

For example, in the method of manufacturing a metal wire provided by at least one embodiment of the present disclosure, the protective coating layer is transparent.

For example, in the method of manufacturing a metal wire provided by at least one embodiment of the present disclosure, after forming the metal material layer on the base substrate, the manufacture method further comprises: forming a photoresist pattern on the metal material layer, and performing an etching process on the metal material layer by using the photoresist pattern as a mask.

For example, in the method of manufacturing a metal wire provided by at least one embodiment of the present disclosure, the etching process is an inductively coupled plasma etching process.

For example, in the method of manufacturing a metal wire provided by at least one embodiment of the present disclosure, in the composite gas, a volume ratio of the etching gas to the coating reaction gas is (3-10):1.

For example, in the method of manufacturing a metal wire provided by at least one embodiment of the present disclosure, a material of the metal material layer comprises aluminum or titanium, and the etching gas comprises a chlorine-containing etching gas.

For example, in the method of manufacturing a metal wire provided by at least one embodiment of the present disclosure, the chlorine-containing etching gas comprises one or more selected from a group consisting of $Cl_2$, $BCl_3$, and $CCl_4$.

For example, in the method of manufacturing a metal wire provided by at least one embodiment of the present disclosure, a material of the metal material layer comprises aluminum or titanium, and the coating reaction gas comprises nitrogen and/or methane.

At least one embodiment of the present disclosure provides a method of manufacturing a metal wire grid, the metal wire grid comprises a plurality of metal wires which are juxtaposed with each other, and the manufacture method comprises: forming the plurality of metal wires of the metal wire grid by the manufacture method described in any one of the above embodiments.

For example, in the method of manufacturing a metal wire grid provided by at least one embodiment of the present disclosure, in a case where the plurality of metal wires are formed by etching, a pressure in a cavity of an etching device is set to be 5 mt-20 mt, and a temperature of a side wall of the cavity is set to be 70° C.-90° C.

For example, in the method of manufacturing a metal wire grid provided by at least one embodiment of the present disclosure, in a case where the plurality of metal wires are formed by etching, a power supply power, for forming a plasma, of the etching device is 1500 w-3000 w, and a bias power supply power used for forming a plasma impact direction is 0-500 w.

For example, in the method of manufacturing a metal wire grid provided by at least one embodiment of the present disclosure, an etching gas comprises $Cl_2$ and $BCl_3$, a flow rate of $Cl_2$ ranges from 100 sccm to 300 sccm, and a flow rate of $BCl_3$ ranges from 10 sccm to 100 sccm.

For example, in the method of manufacturing a metal wire grid provided by at least one embodiment of the present disclosure, a coating reaction gas comprises $CH_4$ and $N_2$, a flow rate of $CH_4$ ranges from 5 sccm to 50 sccm, and a flow rate of $N_2$ ranges from 5 sccm to 50 sccm.

At least one embodiment of the present disclosure provides a wire grid polarizer, comprising a metal wire grid and a protective coating layer on at least a part of lateral side walls of the metal wire grid.

For example, the wire grid polarizer provided by at least one embodiment of the present disclosure further comprises a planarization layer used for planarizing the metal wire grid.

For example, in the wire grid polarizer provided by at least one embodiment of the present disclosure, a material of the metal wire grid comprises aluminum and a material of the protective coating layer comprises aluminum nitride and/or hydrocarbon polymer; or, a material of the metal wire grid comprises titanium and a material of the protective coating layer comprises titanium nitride and/or hydrocarbon polymer.

For example, in the wire grid polarizer provided by at least one embodiment of the present disclosure, a material of the metal wire grid comprises aluminum and a material of the protective coating layer comprises aluminum oxide; or, a material of the metal wire grid comprises titanium and a material of the protective coating layer comprises titanium oxide.

For example, in the wire grid polarizer provided by at least one embodiment of the present disclosure, a line width of the metal wire grid ranges from 50 nm to 100 nm, a line pitch of the metal wire grid ranges from 50 nm to 100 nm, and a line height of the metal wire grid ranges from 100 nm to 300 nm.

At least one embodiment of the present disclosure provides an electronic device, comprising the wire grid polarizer provided by any one of the above embodiments.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

Figure 1:
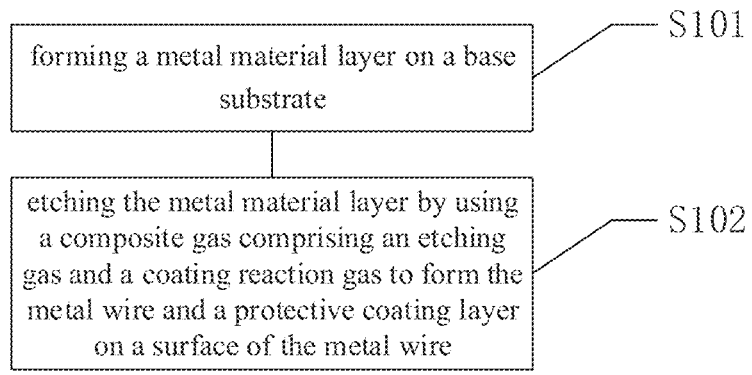
FIG. 1 a flow chart of a method of manufacturing a metal wire provided by some embodiments of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

A metal wire can be manufactured, for example, by a dry etching process. In the dry etching process, a radio frequency power source can be used to make reactive gases generate ions and electrons with high reactivity, which perform physical bombardment and chemical reaction on the material (layer) to be etched, so as to selectively remove areas, need to be removed, of the material to be etched, the etched material becomes a volatile gas and is exhausted by a pumping system. During the etching process, the required depth can be etched as needed.

In the actual production process, the reactive gas used in the dry etching process may react with a part of the metal material that is not desired to be etched, in a case where a size of the metal wire is small, or in a case where a plurality of juxtaposed metal wires are manufactured and a distance between adjacent metal wires is small, the amount of the etched part of the metal material cannot be ignored, and therefore the pattern appearance of the obtained metal wire is seriously affected, or the distance between adjacent metal wires cannot be controlled, such that the shape and size of the obtained metal wire are largely different from the desired shape and size.

At least one embodiment of the present disclosure provides a method of manufacturing a metal wire, comprising: forming a metal material layer on a base substrate; and etching the metal material layer by using a composite gas comprising an etching gas and a coating reaction gas to form a metal wire and a protective coating layer on a surface of the metal wire.

At least one embodiment of the present disclosure provides a method of manufacturing a metal wire grid, the metal wire grid comprises a plurality of metal wires which are juxtaposed with each other, and the manufacture method comprises: forming the plurality of metal wires by the above-described manufacture method.

At least one embodiment of the present disclosure provides a wire grid polarizer, comprising a metal wire grid and a protective coating layer on at least a part of lateral side walls of the metal wire grid.

At least one embodiment of the present disclosure provides an electronic device, comprising the above-described wire grid polarizer.

Hereinafter, the method of manufacturing a metal wire, the method of manufacturing a metal wire grid, the wire grid polarizer, and the electronic device of the present disclosure will be described by several specific embodiments.

At least one embodiment of the present disclosure provides a method of manufacturing a metal wire, as shown in FIG. 1, the manufacture method comprises step S101 and step S102.

Step S101: forming a metal material layer on a base substrate.

Figure 2A:
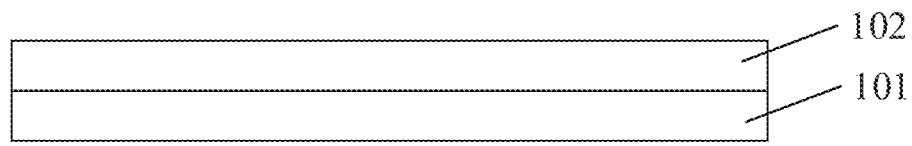
FIGS. 2A and 2B are schematic diagrams of a metal wire in a manufacture process provided by some embodiments of the present disclosure.

For example, as shown in FIG. 2A, first, a metal material layer 102 is formed on a base substrate 101. For example, the base substrate 101 may be a glass substrate, a quartz substrate, or any other substrate of various materials. The metal material layer 102 is formed of a material of the metal wire to be prepared, and therefore the material can be selected according to actual needs.

Step S102: etching the metal material layer by using a composite gas comprising an etching gas and a coating reaction gas to form a metal wire and a protective coating layer on a surface of the metal wire.

Figure 2B:
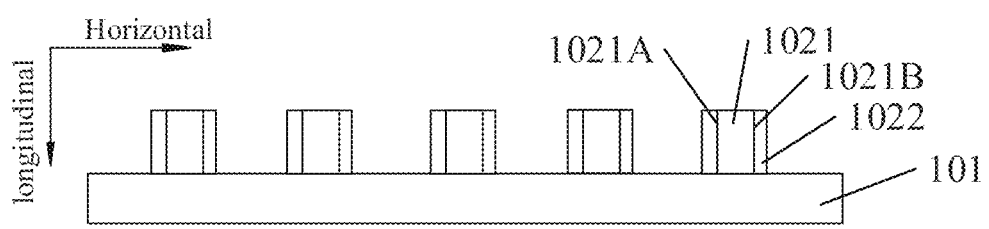

For example, as shown in FIG. 2B, the metal material layer 102 is etched by a composite gas comprising an etching gas and a coating reaction gas to form a metal wire 1021 and a protective coating layer 1022 on a surface of the metal wire 1021.

In the embodiment, the etching process used here is a plasma etching process, and the plasma etching process is, for example, a reactive ion etching (RIE) process, an inductively coupled plasma (ICP) etching process, a capacitive coupled plasma (CCP) etching process, or a microwave electron cyclotron resonance (ECR) etching process. The etching gas used can, for example, bombard a region to be etched of the metal material layer 102 with a certain kinetic energy, and reacts with the metal material of the region to be etched, the metal material participating in the reaction becomes a volatile gas which can be exhausted. The coating reaction gas can react on an exposed surface of the metal material layer 102, for example, react with a material on the surface of the metal material layer 102 or with the coating reaction gas itself, so that the protective coating layer 1022 can be formed on the surface of the metal material layer 102. In some embodiments, the obtained metal wire and the protective coating layer on the surface of the metal wire are densely bonded to each other, such that the metal wire and the protective coating layer are integrally formed.

For example, as shown in FIG. 2B, as the reaction proceeds, lateral side walls 1021A and 1021B of the etched metal wire 1021 are gradually formed, in this case, the protective coating layer 1022 may be formed on at least a part of lateral side walls of the metal wire 1021, for example, formed on part or all of the lateral side walls 1021A and 1021B. For example, the protective coating layer 1022 can protect the formed lateral side walls 1021A and 1021B, thereby preventing the lateral side walls 1021A and 1021B from being further etched. For example, the protective coating layer 1022 formed on the lateral side walls 1021A and 1021B can prevent the etching gas from horizontally etching the metal wire 1021 (that is, the etching gas is prevented from etching the metal wire 1021 in a direction parallel to a plane in which the top surface of the metal material layer 102 is located). In a longitudinal direction (that is, a direction perpendicular to the plane in which the top surface of the metal material layer 102 is located), the etching process can be continued by the impact force of the etching gas or the like, thereby ensuring the directionality of the etching, for example, the perpendicularity of etching the metal wire 1021 can be ensured, and the size and the shape of the metal wire 1021 can be controlled, so that the size and shape of the formed metal wire 1021 are closer to a target size and shape.

For example, in an embodiment, the protective coating layer 1022 can be transparent. In this case, where the metal wire 1021 is used to form a metal wire grid of a wire grid polarizer, the transparent protective coating layer 1022 does not affect a polarization effect of the metal wire grid on light.

Figure 3:
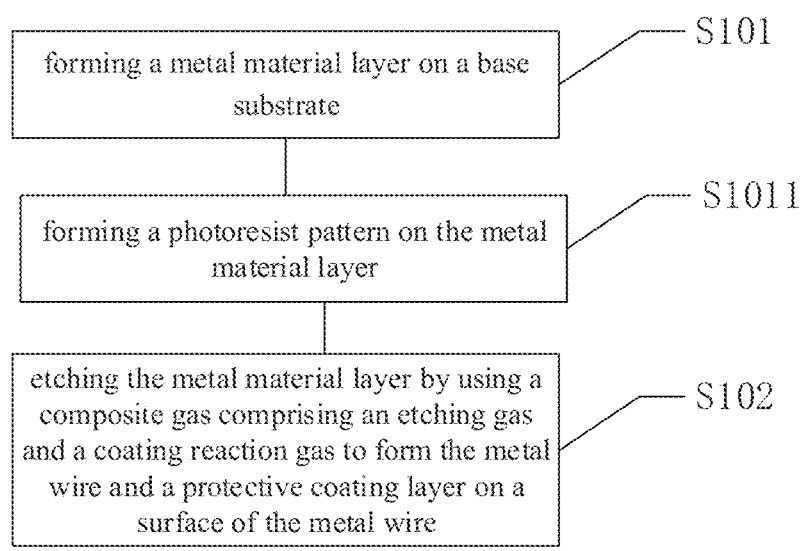
FIG. 3 a flow chart of another method of manufacturing a metal wire provided by some embodiments of the present disclosure.

For example, in an embodiment, as shown in FIG. 3, after the metal material layer is formed on the base substrate, the method of manufacturing the metal wire may further comprise step S1011.

Step S1011: forming a photoresist pattern on the metal material layer.

Figure 4A:
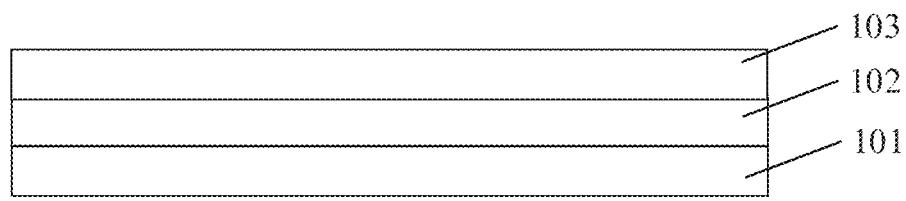
FIGS. 4A to 4D are another schematic diagrams of a metal wire in a manufacture process provided by some embodiments of the present disclosure.
Figure 4B:
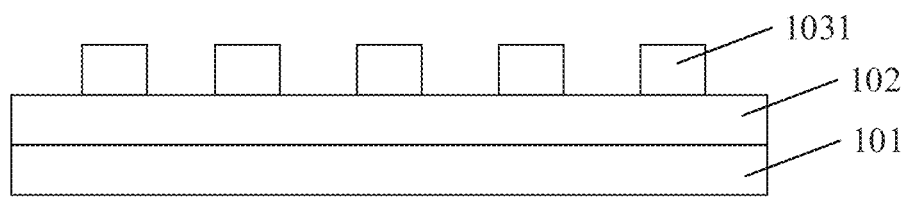
Figure 4C:
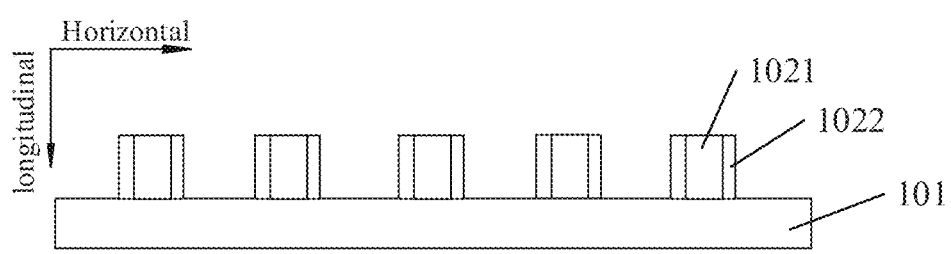

For example, as shown in FIG. 4A, after the metal material layer 102 is formed, a photoresist material layer 103 may be formed on the metal material layer 102. Then, as shown in FIG. 4B, for example, the photoresist material layer 103 is patterned by an exposure and development method or an imprint method to form a photoresist pattern 1031. Finally, as shown in FIG. 4C, the metal material layer 102 is etched by using the photoresist pattern 1031 as a mask in the etching process, so as to form the metal wire 1021 and the protective coating layer 1022 on the surface of the metal wire 1021.

For example, in an embodiment, the plasma etching method adopts the inductively coupled plasma etching process. The inductively coupled plasma etching process uses a coil connected to a first power source to generate an inductively coupled first electric field, and the etching gas glows to discharge to generate plasma under the action of the first electric field. For example, an ionization rate of the etching gas can be adjusted by selecting a power of the first power source, thereby controlling the density of the generated plasma. For example, the inductively coupled plasma etching process can also use a second power source to generate a second electric field near the material to be etched, and the second electric field can be used to increase the rate at which the plasma bombards the material to be etched. For example, the rate at which the plasma bombards the material to be etched can be adjusted by selecting a power of the second power source, thereby controlling the energy with which the plasma bombards the etching material.

In this embodiment, the inductively coupled plasma etching process can convert the etching gas into a plasma form, on one hand, the chemical activity of the plasma is stronger, and depending on the different materials to be etched, a suitable gas can be selected and can react with the material to be etched more quickly to achieve etching; on the other hand, the inductively coupled plasma etching process can also use an electric field to guide and accelerate the plasma to allow the plasma to have a certain energy, in a case where the plasma bombards the surface of the material to be etched, the atoms of the material to be etched are struck out, so that the physical energy transfer can also be used to achieve the purpose of etching.

For example, in the composite gas, a volume ratio of the etching gas to the coating reaction gas may be (3-10):1, for example, 4:1, 5:1, 6:1, 7:1, 8:1, 9:1, and the like, and the volume ratio can be selected, for example, according to actual situations such as the type of the coating reaction gas, the reaction type of the coating reaction gas, and the like. At this volume ratio, the etching gas can smoothly perform etching without being affected by the coating reaction gas, at the same time, the coating reaction gas can form the protective coating layer having a certain thickness on the lateral side walls of the exposed metal material after etching, for example, the protective coating layer comprises metal nitride and/or hydrocarbon polymer to protect the lateral side walls of the metal wire that have been formed by etching.

For example, in an embodiment, a material of the metal material layer comprises aluminum or an aluminum alloy, and the etching gas comprises a chlorine-containing etching gas. For example, the chlorine-containing etching gas comprises one or more selected from a group consisting of $Cl_2$, $BCl_3$, and $CCl_4$. For example, the etching gas is $Cl_2$ alone, $BCl_3$ alone, a combination of $Cl_2$ and $BCl_3$, a combination of $Cl_2$ and $CCl_4$, or the like. For example, the metal aluminum can react with the chlorine-containing etching gas as follows:

$$Al+Cl^* \rightarrow AlCl_3 \uparrow$$

where Cl* represents the chlorine-containing etching gas, and the metal aluminum reacts with the chlorine-containing etching gas to form aluminum chloride which is volatile, thereby achieving etching.

For example, in a case where the material of the metal material layer comprises the metal aluminum, the coating reaction gas may be selected to be nitrogen ($N_2$) and/or methane ($CH_4$). In this case, the coating reaction gas can, for example, react as follows:

$$CH_2^* \rightarrow [CH_2]_n$$

$$N_2 + Al \rightarrow Al_xN$$

Where a size of n in $[CH_2]_n$ varies depending on factors such as the degree of reaction, for example, n ranges from 10 to 10000, such as 100 to 1000, and the like. For example, in a case where the coating reaction gas is selected to be nitrogen, the protective coating layer which can be formed on the surface, such as the lateral side walls, of the formed metal wire is aluminum nitride; in a case where the coating reaction gas is selected to be methane, the protective coating layer which can be formed on the surface, such as the lateral side walls, of the formed metal wire is hydrocarbon polymer; in a case where the coating reaction gas is selected to be a composite gas of nitrogen and methane, a composite coating layer comprising aluminum nitride and hydrocarbon polymer may be formed on the surface, such as the lateral side walls, of the formed metal wire. For example, in some embodiment, after the metal wire is manufactured, or in a subsequent processing process, the surface of the metal wire may be in contact with oxygen, in this case, the protective coating layer formed on the surface, such as the lateral side walls, of the metal wire may further comprise aluminum oxide. The above protective coating layer in various forms can effectively protect the metal wire, and the embodiment is not limited thereto.

For example, in an embodiment, the material of the metal material layer comprises titanium or a titanium alloy, and the etching gas comprises a chlorine-containing etching gas. For example, the chlorine-containing etching gas comprises one or more of a group consisting of $Cl_2$, $BCl_3$, and $CCl_4$. For example, the chlorine-containing etching gas is $Cl_2$ alone, $BCl_3$ alone, a combination of $Cl_2$ and $BCl_3$, a combination of $Cl_2$ and $CCl_4$, or the like. For example, the metal titanium can react with the chlorine-containing etching gas as follows:

$$Ti+Cl^* \rightarrow TiCl_4 \uparrow$$

where Cl* represents the chlorine-containing etching gas, and the metal titanium reacts with the chlorine-containing etching gas to form titanium chloride which is volatile, thereby achieving etching.

For example, in a case where the material of the metal material layer comprises the metal titanium, the coating reaction gas may be selected to be nitrogen ($N_2$) and/or methane ($CH_4$). In this case, the coating reaction gas can, for example, react as follows:

$$CH_2^* \rightarrow [CH_2]_n$$

$$N_2 + Ti \rightarrow Ti_xN$$

For example, in a case where the coating reaction gas is selected to be nitrogen, the protective coating layer which can be formed on the surface, such as the lateral side walls, of the formed metal wire is titanium nitride; in a case where the coating reaction gas is selected to be methane, the protective coating layer which can be formed on the surface, such as the lateral side walls, of the formed metal wire is hydrocarbon polymer; in a case where the coating reaction gas is selected to be a composite gas of nitrogen and methane, a composite coating layer comprising titanium nitride and hydrocarbon polymer may be formed on the surface, such as the lateral side walls, of the formed metal wire. For example, in some embodiment, after the metal wire is manufactured, or in a subsequent processing process, the surface of the metal wire may be in contact with oxygen, in this case, the protective coating layer formed on the surface, such as the lateral side walls, of the metal wire may further comprise titanium oxide. The above protective coating layer in various forms can effectively protect the metal wire.

In the embodiments of the present disclosure, the material of the metal material layer may, of course, also be any other suitable material, and a corresponding etching gas and a corresponding coating reaction gas are selected according to the type of the metal material, and the embodiments of the present disclosure do not enumerate one by one.

Figure 4D:
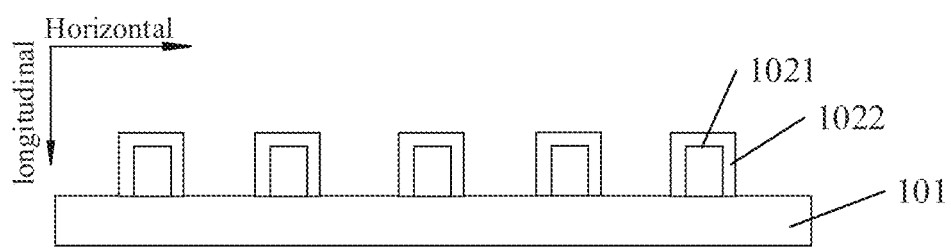

In the embodiments of the present disclosure, as shown in FIG. 4D, for example, the protective coating layer 1022 on the surface of the metal wire 1021 may also be formed on a top surface of the metal wire 1021, and therefore the protective coating layer 1022 covers the metal wire 1021.

Figure 5A:
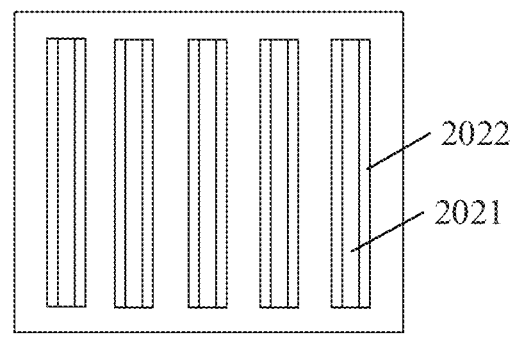
FIG. 5A is a schematic plane diagram of a metal wire grid provided by some embodiments of the present disclosure.
Figure 5B:
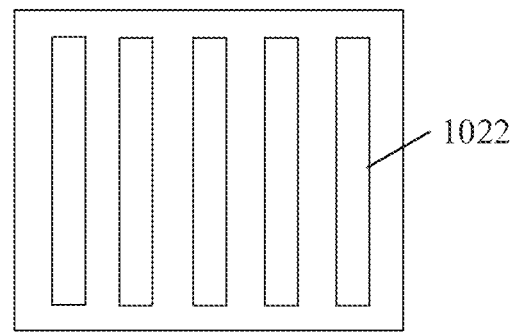
FIG. 5B is a schematic plane diagram of another metal wire grid provided by some embodiments of the present disclosure.

At least one embodiment of the present disclosure provides a method of manufacturing a metal wire grid, as shown in FIG. 5A, the metal wire grid comprises a plurality of metal wires 2021 which are juxtaposed with each other. The manufacture method comprises: forming the plurality of metal wires 2021 of the metal wire grid by any one of the above manufacture methods, so that protective coating layers 2022 (a cross-sectional view is shown in FIG. 4C) are further formed on at least a part of lateral side walls of the plurality of metal wires 2021. For example, in some embodiments, as shown in FIG. 5B, the protective coating layers 2022 are also formed on the top surfaces of the plurality of metal wires 2021, so that the protective coating layers 2022 covers the metal wires 2021 (a cross-sectional view is shown in FIG. 4D).

For example, in an example, forming the metal wire grid comprises the following steps: using a glass substrate as the base substrate, and forming an aluminum metal layer having a thickness of 100 nm to 200 nm by a method such as sputtering, deposition or the like on the glass substrate, and then forming a silicon dioxide ($SiO_2$) layer having a thickness of 50 nm to 100 nm by a method such as deposition or the like on the aluminum metal layer, after the silicon dioxide layer is patterned, the silicon dioxide layer can be used as a mask for etching the aluminum metal layer, the mask has a high hardness and can withstand the impact of the etching gas during the subsequent process of performing a dry etching process on the aluminum metal layer.

For example, a photoresist layer is formed on the silicon dioxide layer, the photoresist layer is patterned by a nano-imprinting method, and then the silicon dioxide layer is patterned using a patterned photoresist to form a silicon dioxide mask with higher hardness, finally, the aluminum metal layer is etched using the silicon dioxide mask. For example, in an example, the aluminum metal layer is dry etched using an inductively coupled plasma (ICP) dry etching device of model G2.5 of a YAC company to form the plurality of metal wires of the metal wire grid.

For example, during the dry etching process, a pressure in a cavity of a dry etching device is set to be 5 mt-20 mt, such as 10 mt, 15 mt, or the like, a temperature of side walls of the cavity is set to be 70° C.-90° C., such as 80° C.; a temperature of a machine for bearing the glass substrate is set to be 50° C.-70° C., such as 60° C.; a power supply power for forming a plasma is 1500 w-3000 w, such as 2000 w, 2500 w, or the like; a bias power supply power used for forming a plasma impact direction is 0-500 w, such as 200 w, 300 w, or the like. The etching gas comprises $Cl_2$ and $BCl_3$, a flow rate of $Cl_2$ is set to be 100 sccm-300 sccm, such as 150 sccm, 200 sccm, or the like, a flow rate of $BCl_3$ is set to be 10 sccm-100 sccm, such as 50 sccm, 80 sccm, or the like. The coating reaction gas comprises $CH_4$ and $N_2$, a flow rate of $CH_4$ is set to be 5 sccm-50 sccm, such as 20 sccm, 35 sccm, or the like; and a flow rate of $N_2$ is set to be 5 sccm-50 sccm, such as 20 sccm, 35 sccm, or the like. In addition, parameters in the manufacture process are not limited to the above examples, and appropriate parameters may be selected according to actual conditions and manufacture requirements.

For example, after the dry etching process is completed, an ashing process is performed on the residual photoresist, for example, the residual photoresist is removed using $O_2$ plasma, and then the residual silicon dioxide mask is removed using $CHF_3$ or $CF_4$ plasma to expose the entire metal wire grid. Finally, a silicon dioxide ($SiO_2$) layer is formed on the surface of the metal wire grid by a deposition method or the like, and the silicon dioxide layer serves as a planarization protective layer.

In a case where the plurality of metal wires 2021 are formed by the method provided in this embodiment, the protective coating layers 2022 are further formed on at least a part of lateral side walls of the plurality of metal wires 2021, and the protective coating layers 2022 can protect the plurality of metal wires 2021 from unnecessary corrosion. For example, during the process of forming the plurality of metal wires 2021, the protective coating layers 2022 can prevent the plurality of metal wires 2021 from being horizontally etched, thereby ensuring the directionality of the etching, for example, the perpendicularity of etching the plurality of metal wires 2021 can be ensured, moreover, the sizes and the shapes of the plurality of metal wires 2021 can be controlled, so that the sizes and shapes of the formed plurality of metal wires 2021 are closer to target sizes and shapes. For example, in a case where a width of the metal wire 2021 of the metal wire grid to be formed is narrow or a distance between adjacent metal wires 2021 is small, the metal wire grid formed by the method provided by the embodiments has higher accuracy in size and shape, and therefore has higher quality.

For example, a metal wire grid in a wire grid polarizer can be manufactured by the above method. The wire grid polarizer can selectively transmit polarized light in a certain direction. For example, in a case where natural light irradiates onto the wire grid polarizer, a portion component of the light that is parallel to a direction in which the metal wires extend can be reflected, and a portion component of the light that is perpendicular to the direction in which the metal wires extend can be transmitted, so that the light passing through the wire grid polarizer is polarized light perpendicular to the direction in which the metal wires extend.

Figure 6A:
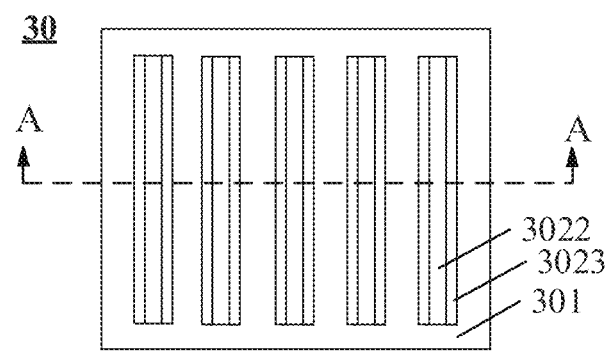
FIG. 6A is a schematic plane diagram of a metal wire grid polarizer provided by some embodiments of the present disclosure.
Figure 6B:
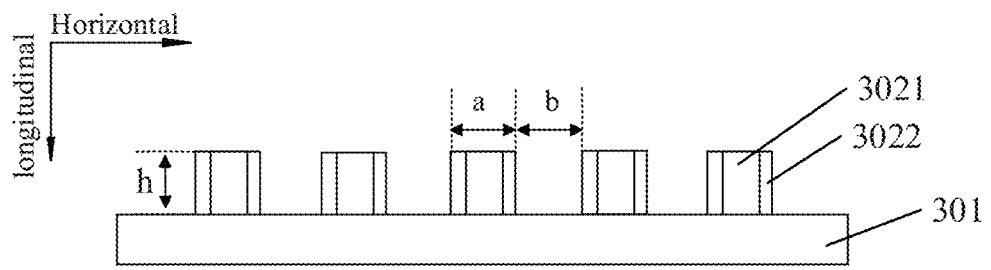
FIG. 6B is a schematic cross-sectional diagram of the metal wire grid polarizer in FIG. 6A taken along a line A-A.

At least one embodiment of the present disclosure provides a wire grid polarizer, as shown in FIGS. 6A and 6B, the wire grid polarizer 30 comprises a metal wire grid 3021 and a protective coating layer 3022 on at least a part of lateral side walls of the metal wire grid 3021. For example, the metal wire grid 3021 of the wire grid polarizer 30 can be obtained according to the above-described method of manufacturing the metal wire grid. For example, the wire grid polarizer 30 further comprises a base substrate 301, and the metal wire grid 3021 is formed on the base substrate 301. For example, the base substrate 301 is a glass substrate.

For example, as shown in FIGS. 6A and 6B, a line width a of the metal wire grid 3021 may range from 50 nm to 100 nm, such as 70 nm, 80 nm, 90 nm, or the like; a line pitch b of the metal wire grid 3021 may range from 50 nm to 100 nm, such as 60 nm, 70 nm, 80 nm, 90 nm, or the like; a line height h of the metal wire grid 3021 may range from 100 nm to 300 nm, such as 150 nm, 200 nm, 250 nm, or the like. For example, a size of the metal wire grid 3021 can be selected according to actual needs, and the embodiments of the present disclosure are not limited thereto. For example, in a case where the line width a and the line pitch b of the metal wire grid 3021 are both at the nanometer size level, the wire grid polarizer 30 formed by the above manufacture method can have higher accuracy in size and shape, for example, the metal wire grid has better perpendicularity, a higher aspect ratio (a ratio of the line height h to the line width a), and the manufacture process of the metal wire grid is simple, which is advantageous for mass production.

Figure 7:
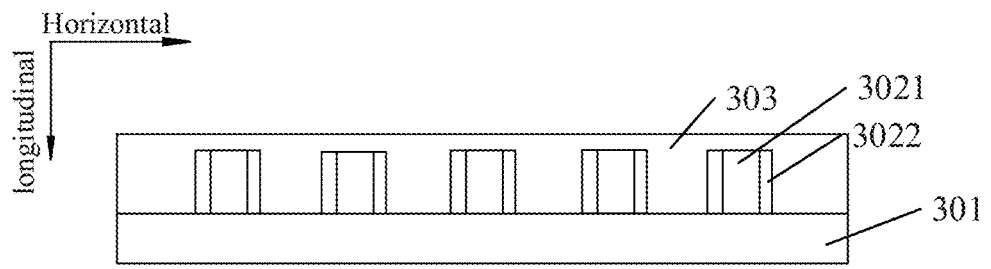
FIG. 7 is a schematic cross-sectional diagram of another metal wire grid polarizer provided by some embodiments of the present disclosure.

For example, in an embodiment, as shown in FIG. 7, the wire grid polarizer 30 may further comprise a planarization layer 303, the planarization layer 303 is disposed, for example, on the metal wire grid 3021 to planarize a surface of a layer where the metal wire grid 3021 is located, thereby facilitating subsequent use of the wire grid polarizer 30. For example, the planarization layer 303 may be formed of an inorganic material such as silicon dioxide ($SiO_2$), so that the planarization layer 303 may also have a good light transmittance.

For example, in an embodiment, the protective coating layer 3022 on the surface of the metal wire grid 3021 is transparent, so that the protective coating layer 3022 does not affect the polarization effect of the metal wire grid 3021 on light.

For example, a material of the metal wire grid 3021 may be aluminum or aluminum alloy, and in this case a material of the protective coating layer 3022 is aluminum oxide and/or hydrocarbon polymer; alternatively, a material of the metal wire grid 3021 may be titanium or titanium alloy, and in this case a material of the protective coating layer 3022 is titanium oxide or hydrocarbon polymer.

Figure 8:
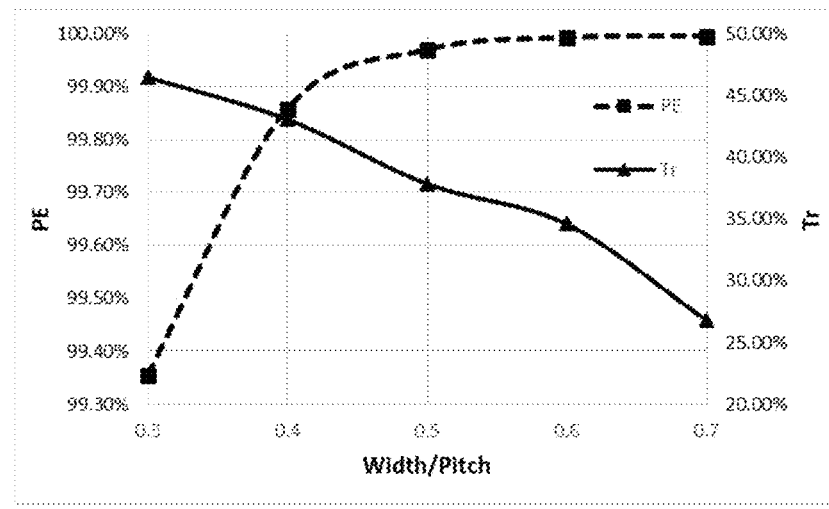
FIG. 8 is a diagram showing a performance test result of a metal wire grid polarizer provided by some embodiments of the present disclosure.
Figure 9A:
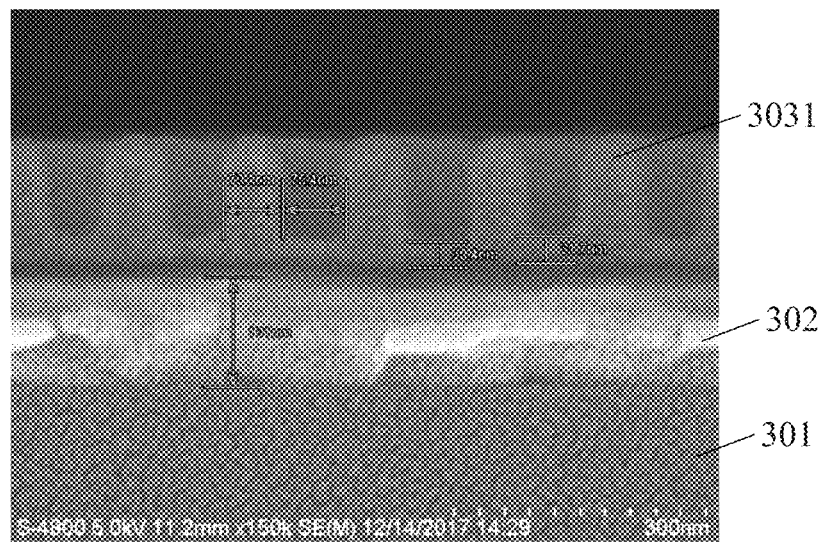
FIGS. 9A and 9B are scanning electron micrographs of a metal wire in a manufacture process provided by some embodiments of the present disclosure.
Figure 9B:
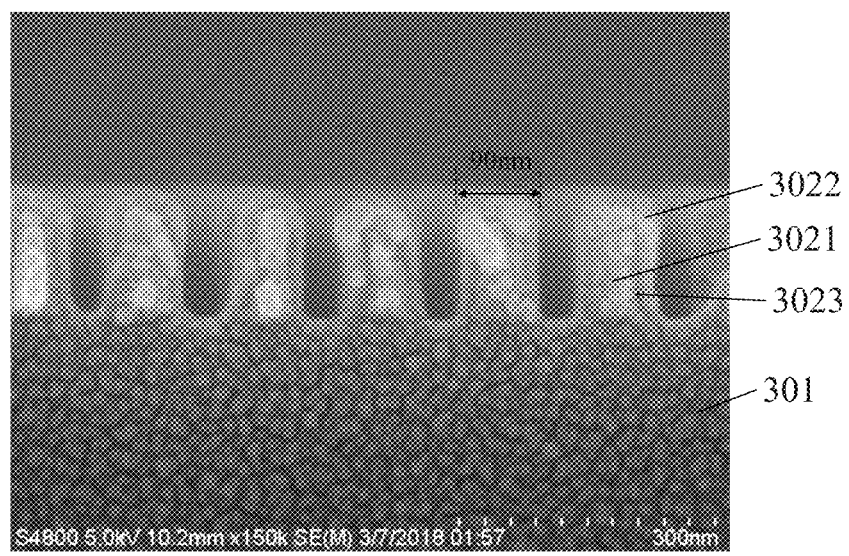

For example, in an embodiment, a material of the metal wire grid 3021 of the wire grid polarizer 30 is metal aluminum, and the metal wire grid 3021 is formed by etching using an etching gas comprising $Cl_2$ and $BCl_3$ and a coating reaction gas comprising nitrogen ($N_2$) and methane ($CH_4$), in this case, the protective coating layer 3022 is a composite coating layer comprising aluminum nitride and hydrocarbon polymer. FIG. 8 shows a performance test result of a wire grid polarizer 30, and FIGS. 9A and 9B shows scanning electron micrographs (SEM) of the above wire grid polarizer 30 before and after manufacture. In the scanning electron micrographs, a portion indicated by a reference numeral 301 is a base substrate, a portion indicated by a reference numeral 302 is a metal material layer, and a portion indicated by a reference numeral 3031 is a photoresist pattern formed by imprinting.

In FIG. 9A, a width of the photoresist pattern 3031 is about 70.1 nm, a distance between adjacent photoresist patterns 3031 is about 75.4 nm, and a residual photoresist material having a thickness of about 30.4 nm to 31.7 nm is located at the bottom of the photoresist pattern 3031. In the wire grid polarizer shown in FIG. 9B formed by using the photoresist pattern 3031 as a mask and using the manufacture method provided in the embodiment, because the surface of the metal wire grid 3021 has the protective coating layer 3022, and therefore a line width of the metal wire grid 3021 is about 90 nm, and the protective coating layer 3022 is transparent, so the metal wire grid 3021 and the protective coating layer 3022 have a distinct boundary, such as the position shown by a reference numeral 3023.

In the performance test result diagram shown in FIG. 8, the abscissa (width/pitch) represents the ratio of the line width a to the line pitch b of the wire grid polarizer 30, and ordinates PE and Tr respectively represent the degree of polarization and transmittance of the wire grid polarizer 30. For example, in a case where the ratio (width/pitch) of the line width a to the line pitch b of the wire grid polarizer 30 is about 0.41, the degree of polarization and transmittance of the wire grid polarizer 30 are 99.9% and 42%, respectively. It can be seen that the wire grid polarizer provided by the embodiment has a higher degree of polarization and a higher transmittance. For example, compared with a metal wire grid polarizer, a material of which is aluminum and a line width of which is 70 nm, formed by an imprint method, the transmittance of the wire grid polarizer provided by the embodiment is increased by 10%, and the degree of polarization remains substantially unchanged. In addition, as shown in FIG. 9B, because of a protective effect of the protective coating layer 3022, the metal wire grid 3021 has a good perpendicularity, and the size and shape of the metal wire grid 3021 are closer to the target size and shape.

Figure 10:
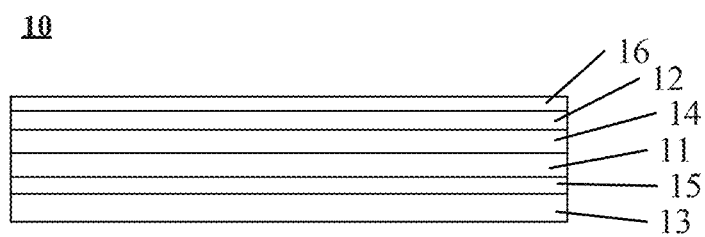
FIG. 10 is a schematic diagram of an electronic device provided by some embodiments of the present disclosure.

At least one embodiment of the present disclosure further provides an electronic device, and the electronic device comprises the wire grid polarizer according to at least one embodiment of the present disclosure. An example of the electronic device is a display device, for example, a liquid crystal display device, as shown in FIG. 10, the liquid crystal display device 10 comprises an array substrate 11, an opposed substrate 12, and a backlight module 13. The array substrate 11 and the opposed substrate 12 are opposed to each other to form a liquid crystal cell, and a liquid crystal material 14 is filled in the liquid crystal cell. The opposed substrate 12 is, for example, a color filter substrate. The array substrate 11 comprises a pixel electrode used for applying an electric field to control the degree of rotation of the liquid crystal material 14, thereby performing a display operation. In the figure, a first wire grid polarizer 15 is formed on a side (a lower side in the figure) of the array substrate 11 close to the backlight module 13, and a second wire grid polarizer 16 is formed on a side (an upper side in the figure) of the opposed substrate 12 away from the backlight module 13. A polarization direction of the first wire grid polarizer 15 and a polarization direction of the second wire grid polarizer 16 are perpendicular to each other.

Another example of the electronic device is a liquid crystal grating, and the liquid crystal grating can achieve the effect of a gating or a lens, for example, can be used to cooperate with a usual 2D display panel to achieve a 3D display effect. The liquid crystal grating comprises an array substrate and an opposed substrate, the array substrate and the opposed substrate are opposed to each other to form a liquid crystal cell, and a liquid crystal material is filled in the liquid crystal cell. Liquid crystal control electrodes are respectively formed on the array substrate and the opposed substrate for achieving a grating or lens effect.

For example, the electronic device 10 may also be a mobile phone, a tablet, a television, a monitor, a notebook computer, a digital photo frame, a navigator, or any product or component having a display function, and the embodiments of the present disclosure are not limited thereto.

The electronic device has a wire grid polarizer having a relatively high degree of polarization and a relatively high transmittance, so that the electronic device has a relatively high display brightness where the electronic device displays, and thus has a relatively high display quality.

The following statements should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness and size of a layer or an area may be enlarged or narrowed, that is, the drawings are not drawn in a real scale. However, it should understood that, in the case in which a component such as a layer, a film, an area, a substrate or the like is referred to be "on" or "under" another component, it may be directly on or under the another component or a component is interposed therebetween.

(3) In case of no conflict, the embodiments of the present disclosure and the features in the embodiment(s) can be combined with each other to obtain new embodiment(s).

What have been described above are only specific implementations of the present disclosure, the protection scope of the present disclosure is not limited thereto. Any modifications or substitutions easily occur to those skilled in the art within the technical scope of the present disclosure should be within the protection scope of the present disclosure. Therefore, the protection scope of the present disclosure should be based on the protection scope of the claims.

What is claimed is:

1. A method of manufacturing a metal wire, comprising:
   forming a metal material layer on a base substrate; and
   etching the metal material layer by using a composite gas comprising an etching gas and a coating reaction gas to form the metal wire and a protective coating layer on a surface of the metal wire;
   wherein the protective coating layer remains at least on a part of lateral side walls of finally formed metal wire; and
   wherein in the composite gas, a volume ratio of the etching gas to the coating reaction gas is (3-10): 1.

2. The method of manufacturing the metal wire according to claim 1, wherein the protective coating layer is transparent.

3. The method of manufacturing the metal wire according to claim 1, wherein after forming the metal material layer on the base substrate, the manufacture method further comprises:
   forming a photoresist pattern on the metal material layer, and performing an etching process on the metal material layer by using the photoresist pattern as a mask.

4. The method of manufacturing the metal wire according to claim 1, wherein the etching process is an inductively coupled plasma etching process.

5. The method of manufacturing the metal wire according to claim 1, wherein a material of the metal material layer comprises aluminum or titanium, and the etching gas comprises a chlorine-containing etching gas.

6. The method of manufacturing the metal wire according to claim 5, wherein the chlorine-containing etching gas comprises one or more selected from a group consisting of $Cl_2$, $BCl_3$, and $CCl_4$.

7. The method of manufacturing the metal wire according to claim 5, wherein a material of the metal material layer comprises aluminum or titanium, and the coating reaction gas comprises nitrogen and/or methane.

8. A method of manufacturing a metal wire grid, wherein the metal wire grid comprises a plurality of metal wires which are juxtaposed with each other, and the manufacture method comprises:
 forming the plurality of metal wires of the metal wire grid by the manufacture method according to claim 1.

9. The method of manufacturing the metal wire grid according to claim 8, wherein in a case where the plurality of metal wires are formed by etching, a pressure in a cavity of an etching device is set to be 5 mt-20 mt, and a temperature of lateral side walls of the cavity is set to be 70° C.-90° C.

10. The method of manufacturing the metal wire grid according to claim 8, wherein in a case where the plurality of metal wires are formed by etching, a power supply power, for forming a plasma, of the etching device is 1500 w-3000 w, and a bias power supply power used for forming a plasma impact direction is 0-500 w.

11. The method of manufacturing the metal wire grid according to claim 8, wherein the etching gas comprises $Cl_2$ and $BCl_3$, a flow rate of $Cl_2$ ranges from 100 sccm to 300 sccm, and a flow rate of $BCl_3$ ranges from 10 sccm to 100 sccm.

12. The method of manufacturing the metal wire grid according to claim 11, wherein the coating reaction gas comprises $CH_4$ and $N_2$, a flow rate of $CH_4$ ranges from 5 sccm to 50 sccm, and a flow rate of $N_2$ ranges from 5 sccm to 50 sccm.

* * * * *